(12) United States Patent
Sato et al.

(10) Patent No.: US 8,680,855 B2
(45) Date of Patent: Mar. 25, 2014

(54) APPARATUS FOR MEASURING MAGNETIC FIELD OF MICROWAVE-ASSISTED HEAD

(71) Applicant: TDK Corporation, Tokyo (JP)

(72) Inventors: Isamu Sato, Tokyo (JP); Hiroshi Ikeda, Tokyo (JP); Mikio Matsuzaki, Tokyo (JP); Tetsuya Roppongi, Tokyo (JP); Noboru Yamanaka, Tokyo (JP); Tsutomu Aoyama, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/726,767

(22) Filed: Dec. 26, 2012

(65) Prior Publication Data

US 2013/0301162 A1    Nov. 14, 2013

Related U.S. Application Data

(62) Division of application No. 12/755,803, filed on Apr. 7, 2010, now Pat. No. 8,358,127.

(51) Int. Cl.
*G01R 33/02*    (2006.01)

(52) U.S. Cl.
USPC .......... 324/250; 324/210; 324/244; 324/257; 324/258; 324/260; 360/31; 360/46; 360/55; 360/313

(58) Field of Classification Search
USPC ....................................... 324/250
See application file for complete search history.

(56) References Cited

U.S. PATENT DOCUMENTS

| | | |
|---|---|---|
| 6,785,092 B2 | 8/2004 | Covington et al. |
| 7,602,588 B2 | 10/2009 | Sato et al. |
| 7,791,838 B2 * | 9/2010 | Sato et al. ............... 360/125.02 |
| 7,986,481 B2 * | 7/2011 | Yamanaka et al. ............. 360/59 |
| 8,264,916 B1 * | 9/2012 | Aoyama et al. ............ 369/13.13 |

(Continued)

FOREIGN PATENT DOCUMENTS

| | | |
|---|---|---|
| JP | 2000-353309 A | 12/2000 |
| JP | 2007-299460 A | 11/2007 |
| JP | 2009-301610 A | 12/2009 |

OTHER PUBLICATIONS

J. Zhu, et al. "Microwave Assisted Magnetic Recording," IEEE Transaction on Magnetics, vol. 44, No. 1, pp. 125-131 (2008) [Discussed on p. 2 of the specification].

*Primary Examiner* — Tung X Nguyen
*Assistant Examiner* — Thang Le
(74) *Attorney, Agent, or Firm* — Posz Law Group, PLC

(57) ABSTRACT

A measuring circuit system in a magnetic field measuring apparatus of the invention has an amplifier and a band-pass filter connected in sequence on an output terminal side of the TMR element, the band-pass filter is a narrow-range band-pass filter such that a peak pass frequency of the filter that is a center is a basic frequency selected from a range of 10 to 40 GHz and a band width centered around the basic frequency is a narrow range of ±0.5 to ±4 GHz; and with the measuring circuit system, an S/N ratio (SNR) of 3 dB or greater is obtained, the SNR being defined by a ratio of an amplitude S of a high-frequency generated signal induced by the TMR element to a total noise N that is a sum of a head noise generated by the TMR element and a circuit noise generated by the amplifier. With such a configuration, an in-plane high-frequency magnetic field generated by a microwave-assisted magnetic head is reliably and precisely measured.

2 Claims, 16 Drawing Sheets

(56) References Cited

U.S. PATENT DOCUMENTS

| | | |
|---|---|---|
| 8,462,465 B1 * | 6/2013 | Adachi et al. ............... 360/245.9 |
| 8,467,150 B2 * | 6/2013 | Takeo et al. ................ 360/125.3 |
| 2006/0166636 A1 | 7/2006 | Sato |
| 2007/0253106 A1 * | 11/2007 | Sato et al. .................... 360/126 |
| 2008/0238411 A1 * | 10/2008 | Kahlman et al. .............. 324/204 |
| 2008/0304176 A1 * | 12/2008 | Takagishi et al. ............... 360/86 |
| 2009/0066318 A1 * | 3/2009 | Kahlman et al. .............. 324/204 |
| 2009/0219018 A1 | 9/2009 | Shimazawa |
| 2010/0007992 A1 * | 1/2010 | Yamada et al. ............... 360/244 |
| 2010/0309576 A1 * | 12/2010 | Albrecht et al. ................ 360/75 |
| 2010/0309577 A1 * | 12/2010 | Gao et al. ....................... 360/75 |
| 2011/0096638 A1 * | 4/2011 | Mochizuki et al. ........ 369/13.33 |
| 2011/0216436 A1 | 9/2011 | Igarashi et al. |

* cited by examiner

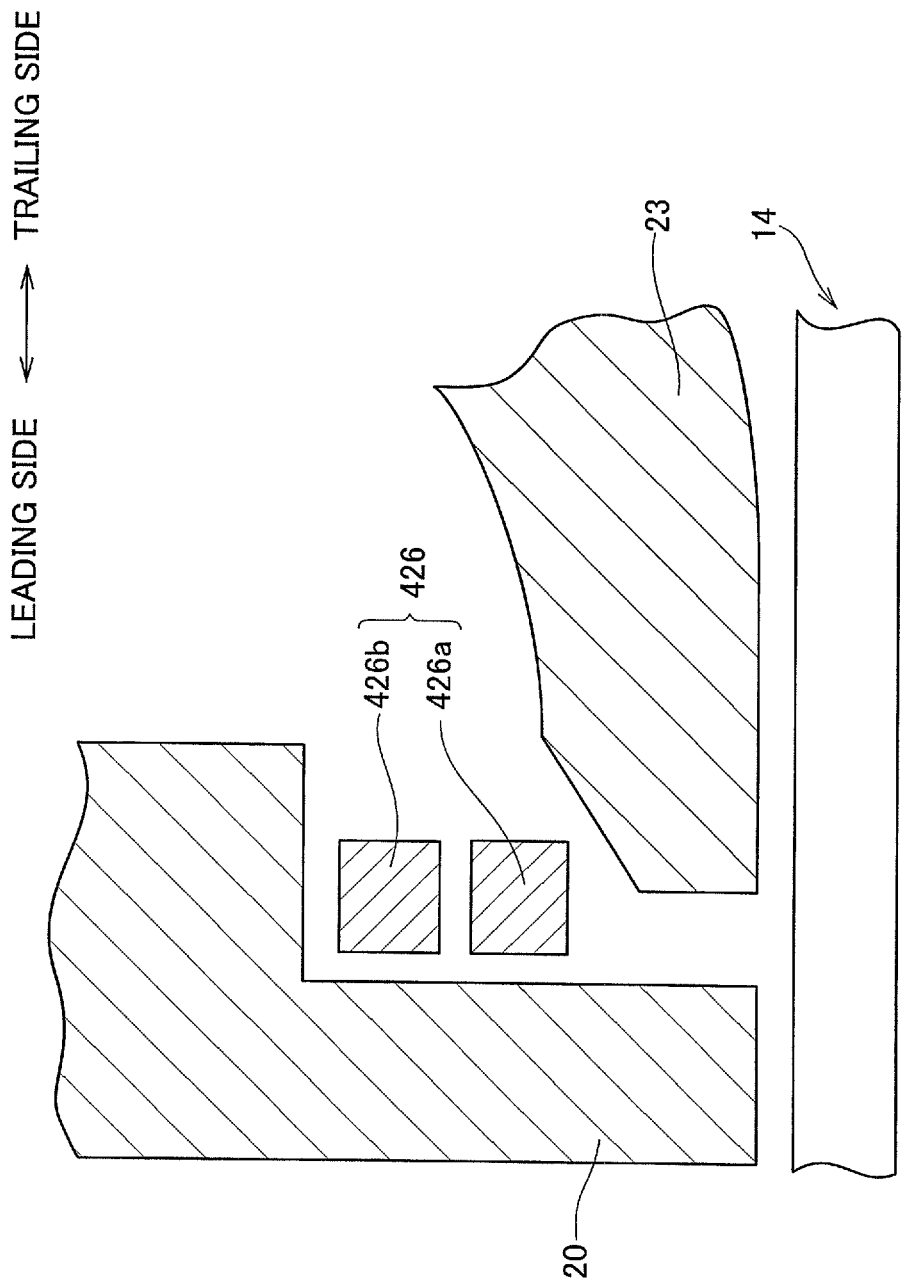

APPARATUS FOR MEASURING MAGNETIC FIELD OF MICROWAVE-ASSISTED HEAD

CROSS REFERENCE TO RELATED APPLICATION

The present application is a divisional of U.S. patent application Ser. No. 12/755,803, entitled APPARATUS FOR MEASURING MAGNETIC FIELD OF MICROWAVE-ASSISTED HEAD, which was filed Apr. 7, 2010 and allowed on Sep. 20, 2012.

BACKGROUND OF THE INVENTION

1. Technical Field

The present invention relates to a device for measuring the in-plane high-frequency magnetic field generated by a microwave-assisted magnetic head.

2. Background

In the past, surface recording density has been notably increased in magnetic recording media, such as hard disks or the like, by improvements, for example, of finer magnetic particles that configure a magnetic recording layer, of materials and finer head processing. Furthermore, recently magnetic recording and reproducing apparatuses have been commercialized with perpendicular magnetic recording methods in which the surface recording density is further improved by magnetizing the recording layer in a direction perpendicular to the surface of the magnetic recording medium. Further improvements in the surface recording density are anticipated in the future.

On the other hand, it is preferable to use as recording materials magnetic particles with large magnetic anisotropic energy Ku (magnetic anisotropic magnetic field Hk) and large coercive force Hc because thermal fluctuation of the recording magnetization tends to occur in correspondence to the greater fineness of recording bits and magnetic particles.

However, when magnetic particles with large magnetic anisotropic energy Ku are used as recording layer materials, the coercive force Hc of the recording layer becomes a large value of, for example, 4 kOe or more. When accomplishing saturation magnetic recording, it is generally said that a recording magnetic field of at least twice as large as the coercive force is necessary. Therefore, with the performance of conventional magnetic heads, cases arose in which it was extremely difficult to achieve saturation magnetization of the recording layer. In other words, there were cases in which recording and erasing magnetic data were difficult.

Magnetic recording of data onto a magnetic recording medium is accomplished by a perpendicular recording magnetic field generated from the tip of the main magnetic pole of the magnetic head. The perpendicular recording magnetic field is generated by applying a current to a main coil positioned adjacent to the main magnetic pole. One method has been studied in order to greatly reduce the perpendicular recording magnetic field that is required for causing the magnetization reversal. The method is conducted by overlapping alternating magnetic fields in an in-plane direction in the microwave band equal to or close to the ferromagnetic resonant frequency of the medium recording layer to a perpendicular recording magnetic field that induces such a magnetization reversal. This assisted recording method is known as microwave assisted magnetic recording (MAMR), and its efficacy has been verified experimentally.

Two methods have primarily been proposed for MAMR. One is a method in which a spin torque oscillator (STO) made of multiple layers of magnetic thin film is formed in a gap between the main magnetic pole and the auxiliary magnetic pole of the magnetic head and a microwave magnetic field in the in-plane direction is generated by driving a bias current and causing the STO to oscillate, for example as noted in reference document 1 (J. Zhu et al; IEEE TRANSACTION ON MAGNETICS, Vol. 44, No. 1, p. 125) (this is sometimes called a self-excited type).

The other is a method in which a supplementary coil is prepared in and/or in the vicinity of the gap between the main magnetic pole and the auxiliary magnetic pole of the magnetic head, and an in-plane alternating magnetic field is generated by driving the alternating current of the microwave band in the supplementary coil, for example as noted in reference document 2 (Japanese Laid-Open Application Publication No. 2007-299460 (sometimes called an induced type).

When considering mass production and commercialization of this type of magnetic head, the high frequency in-plane magnetic field intensities produced by the microwave-assisted magnetic heads must each be precisely measured in order to secure the reliability of the device. Therefore, it is necessary to develop a highly sensitive, low-cost property measuring apparatus.

However, the following significant technical issues are faced in developing this device.

(1) In both self-excited and induced types, a gap between the main magnetic pole and the auxiliary magnetic pole, and another gap in the vicinity thereof, where the in-plane high-frequency magnetic field is generated, are both assumed to be around 30 nm at the largest, so the in-plane high-frequency magnetic field is generated from an extremely tiny region.

(2) In order to realize the microwave-assisted effect, it is considered that a large in-plane high-frequency magnetic field is necessary, for example 2 kOe or greater. Such an in-plane high-frequency magnetic field is required.

(3) The frequency of the in-plane high-frequency magnetic field is the same as or close to the ferromagnetic resonant frequency of the recording layer of the magnetic recording medium that is the target of recording. The value is high because it is said that the value is generally in the range of 10 GHz to 40 GHz.

On the other hand, as a method for measuring the recording magnetic field of magnetic heads used in conventional longitudinal recording, a method has been proposed in which magnetic sensors, specifically a giant magnetoresistive (GMR) heads, are positioned opposite to a flying surface of the magnetic head (see Japanese Laid-Open Application Publication No. 2009-301610).

However, in the details of the proposal in the Japanese publication, the frequency of the recording drive current is around 20 to 700 MHz. This frequency is in a completely different frequency band from the 10 GHz to 40 GHz frequency that the microwave-assisted magnetic head should manifest.

In addition, when a GMR head is used as a measurement sensor, element resistance is low and output is small, so reliable measurements are extremely difficult to obtain only by adjacent positioning because the S/N ratio of the measured signal cannot be guaranteed.

On the other hand, when a tunneling magnetoresistive (TMR) head having much higher generated output than the GMR head is used as a measurement sensor, it is considered that reliable measurement is possible because the element resistance and its output are high so that the S/N ratio of the measurement signal can be guaranteed. However, with a TMR element, the intensity of the external magnetic field that can linearly respond (make a linear response) is at most several tens of Oe. Therefore, further engineering is necessary for measuring in-plane high-frequency magnetic fields generated by microwave-assisted magnetic heads, the in-plane high-frequency magnetic fields being considered around 2 kOe or more. Furthermore, in a TMR element, there is a difficulty to obtain the desired S/N ratio because high-frequency characteristics are poor since the impedance with respect to element resistance is large, and responsiveness corresponding to frequencies of 10 GHz or more generated by the microwave-assisted magnetic head is inadequate.

The present invention was invented in light of these actual circumstances, and it is an objective of this invention to provide a measuring apparatus that can reliably and precisely measure the in-plane high-frequency magnetic field generated by a microwave-assisted magnetic head.

Such a measuring apparatus can assure high density recording and improved recording quality, and can contribute to simplifying, reducing the cost of and increasing the throughput of shipping inspections.

SUMMARY OF THE INVENTION

In order to resolve the issues discussed above, the present invention is a magnetic field measuring apparatus for measuring an in-plane high-frequency magnetic field intensity that is generated from a microwave generation mechanism equipped with a microwave-assisted magnetic head, the measuring apparatus including an anchoring mechanism for anchoring the microwave-assisted magnetic head that is a target of measurement, a high-frequency current driving system for applying a high-frequency current to the microwave generation mechanism equipped with the microwave-assisted magnetic head, a magnetic sensor having a tunneling magnetoresistive (TMR) element for measuring the in-plane high-frequency magnetic field intensity generated from the microwave generation mechanism, a measuring circuit system connected to the magnetic sensor; and a stage capable of moving in three dimensional directions on which the magnetic sensor is mounted, wherein the measuring circuit system has an amplifier and a band-pass filter connected in sequence on an output terminal side of the TMR element, the band-pass filter is a narrow-range band-pass filter such that a peak pass frequency of the filter that is a center is a basic frequency selected from a range of 10 to 40 GHz and a band width centered around the basic frequency is a narrow range of ±0.5 to ±4 GHz; and with the measuring circuit system, an S/N ratio (SNR) of 3 dB or greater is obtained, the SNR being defined by a ratio of an amplitude S of a high-frequency generated signal induced by the TMR element to a total noise N that is a sum of a head noise generated by the TMR element and a circuit noise generated by the amplifier.

In addition, as a preferred configuration of the magnetic field measuring apparatus of the present invention, the amplifier in the measuring circuit system is configured with a pre-amplifier and a main amplifier connected in sequence.

In addition, as a preferred configuration of the magnetic field measuring apparatus of the present invention, the amplifier in the measuring circuit system is a main amplifier.

In addition, as a preferred configuration of the magnetic field measuring apparatus of the present invention, a comparator is connected next to the narrow range band-pass filter in the measuring circuit system.

In addition, as a preferred configuration of the magnetic field measuring apparatus of the present invention, a low-pass filter and a comparator are connected in sequence next to the narrow-range band-pass filter in the measuring circuit system.

In addition, as a preferred configuration of the magnetic field measuring apparatus of the present invention, the magnetic sensor mounted on the stage is positioned facing an air bearing surface (ABS) of the microwave-assisted magnetic head anchored by the anchoring mechanism, and the stage is moved so that the magnetic sensor scans a predetermined region of the ABS, and that the in-plane high-frequency magnetic field intensity generated by the microwave generation mechanism equipped with the microwave-assisted magnetic head is measured by this magnetic sensor.

In addition, as a preferred configuration of the magnetic field measuring apparatus of the present invention, the TMR element has a lamination layer structure with a barrier layer interposed between two magnetic layers.

In addition, as a preferred configuration of the magnetic field measuring apparatus of the present invention, the microwave-assisted magnetic head that is the target of measurement provides a main magnetic pole and an auxiliary magnetic pole, and a main coil for generating a perpendicular recording magnetic field is provided with the main magnetic pole, and a supplementary coil for driving an alternating current in the microwave band is provided in a gap formed with the main magnetic pole and the auxiliary magnetic pole and/or in the vicinity thereof.

In addition, as a preferred configuration of the magnetic field measuring apparatus of the present invention, an in-plane alternating magnetic field is generated by driving the alternating current in the microwave band to the supplementary coil of the microwave-assisted magnetic head, and a frequency of the alternating current is substantially the same as a ferromagnetic resonant frequency of a recording layer of a magnetic recording medium that is a target of recording, and the frequency of the alternating current is in a range of 10 GHz to 40 GHz.

In addition, as a preferred configuration of the magnetic field measuring apparatus of the present invention, the microwave-assisted magnetic head that is the target of measurement provides a main magnetic pole and an auxiliary magnetic pole, and a main coil for generating a perpendicular recording magnetic field is provided with the main magnetic pole, a spin torque oscillator is provided in a gap formed with the main magnetic pole and the auxiliary magnetic pole and/or in the vicinity thereof, the spin torque oscillator being configured with multiple magnetic thin films for generating an alternating current in the microwave band.

In addition, as a preferred configuration of the magnetic field measuring apparatus of the present invention, a spin torque oscillator is oscillated and an in-plane alternating magnetic field is generated by driving a bias current to the spin torque oscillator of the microwave-assisted magnetic head, and an oscillation frequency of the spin torque oscillator is substantially the same as a ferromagnetic resonant frequency of a recording layer of a magnetic recording medium that is a target of recording, and the oscillation frequency is in a range of 10 GHz to 40 GHz.

BRIEF DESCRIPTION OF THE DRAWINGS

FIG. 16 illustrates another preferred configuration of a thin-film magnetic head that provides a supplementary coil between the main magnetic pole and the auxiliary magnetic pole of the magnetic head and in which an alternating current in the microwave band is driven in the supplementary coil, generating an in-plane alternating magnetic field. The figure is an enlarged view of the vicinity of the ABS and a schematic cross-sectional view perpendicular to the track width direction (reference number 14 indicates a magnetic recording medium shown for reference so the positional relationship is clear).

DETAILED DESCRIPTION OF PREFERRED EMBODIMENT

A magnetic field measuring apparatus of the present invention for measuring the in-plane high-frequency magnetic field generated from a microwave-assisted magnetic head is described with reference to FIG. 1 to FIG. 4.

The in-plane high-frequency magnetic field generated from the microwave-assisted magnetic head is, strictly speaking, generated from a microwave generation mechanism contained in the microwave-assisted magnetic head. As a microwave generation mechanism, two types are known: a self-excited type and an induced type. The structure of the microwave-assisted magnetic head that is the target of these measurements is described below.

Figure 1:
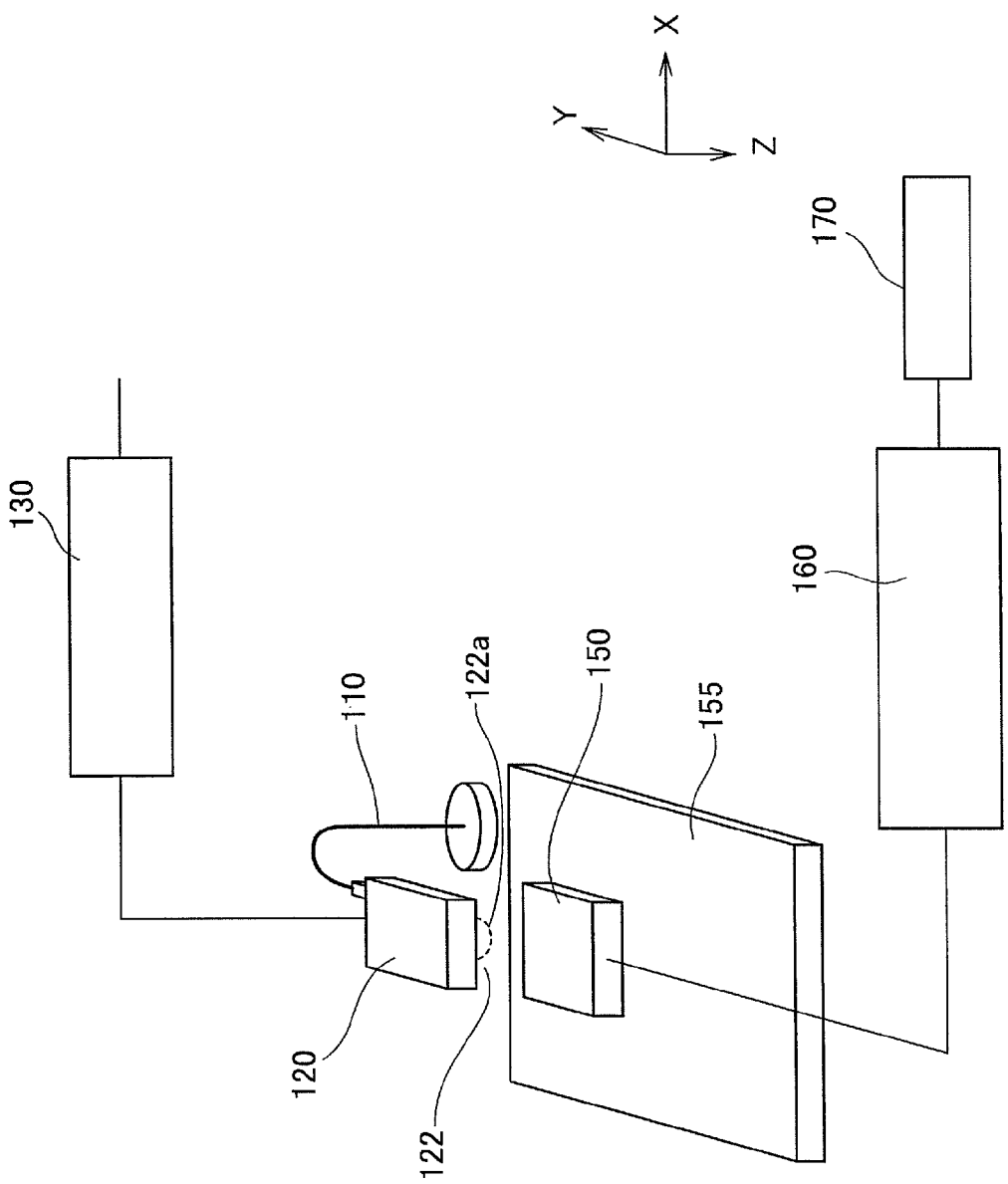
FIG. 1 schematically shows a perspective view of the summary composition of a magnetic field measuring apparatus for measuring the in-plane high-frequency magnetic field generated by a microwave-assisted magnetic head.
Figure 2:
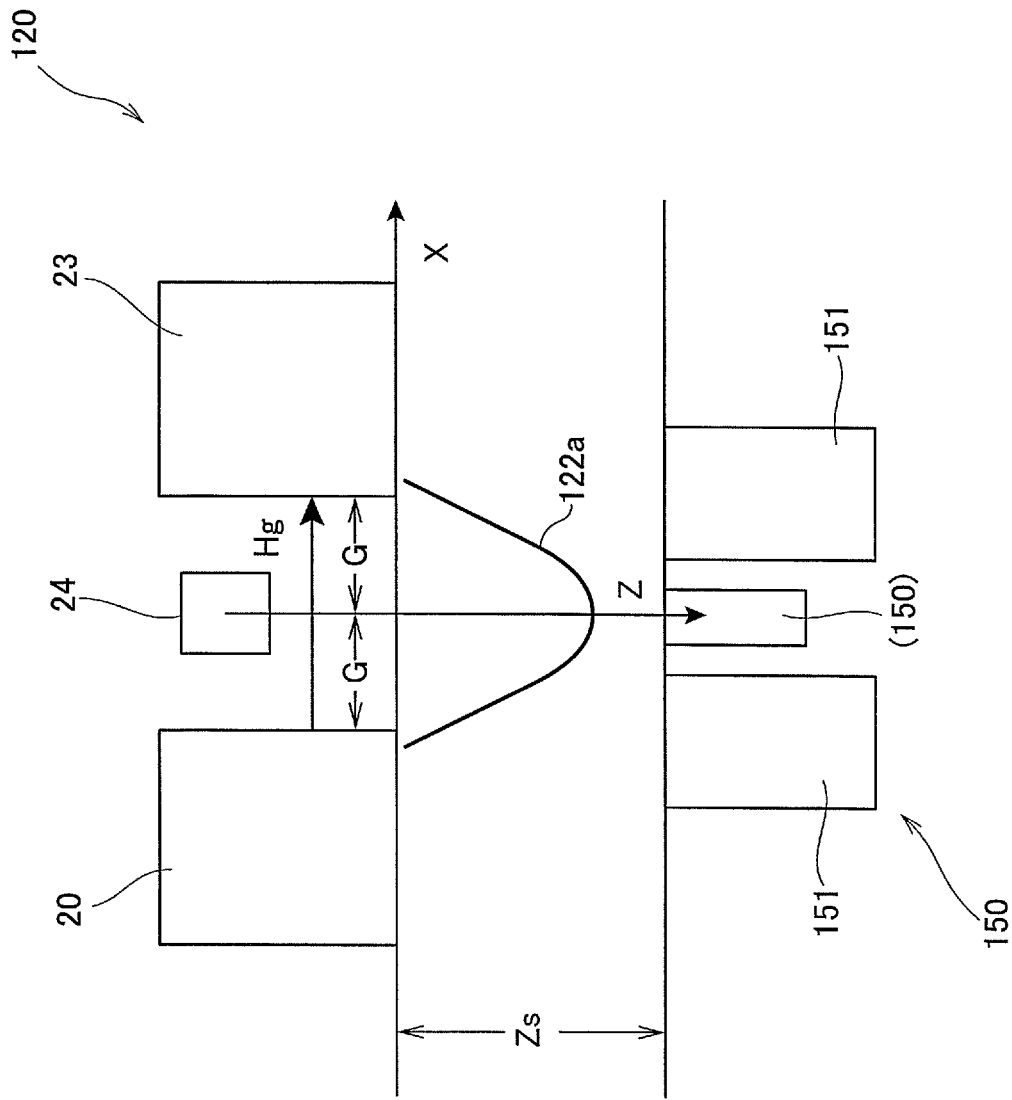
FIG. 2 schematically shows the principle behind using a magnetic field measuring apparatus to measure the in-plane high-frequency magnetic field generated by a microwave-assisted magnetic head.
Figure 3:
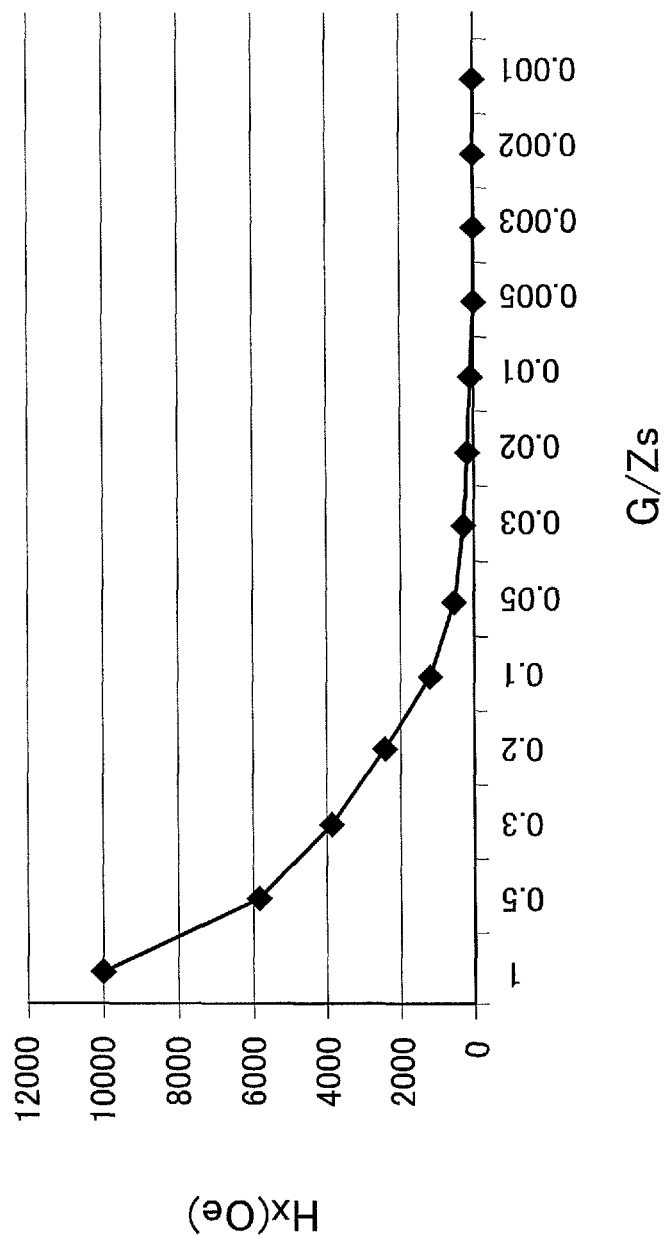
FIG. 3 is a graph showing one example of the effects of spacing when measuring the in-plane high-frequency magnetic field.
Figure 4:
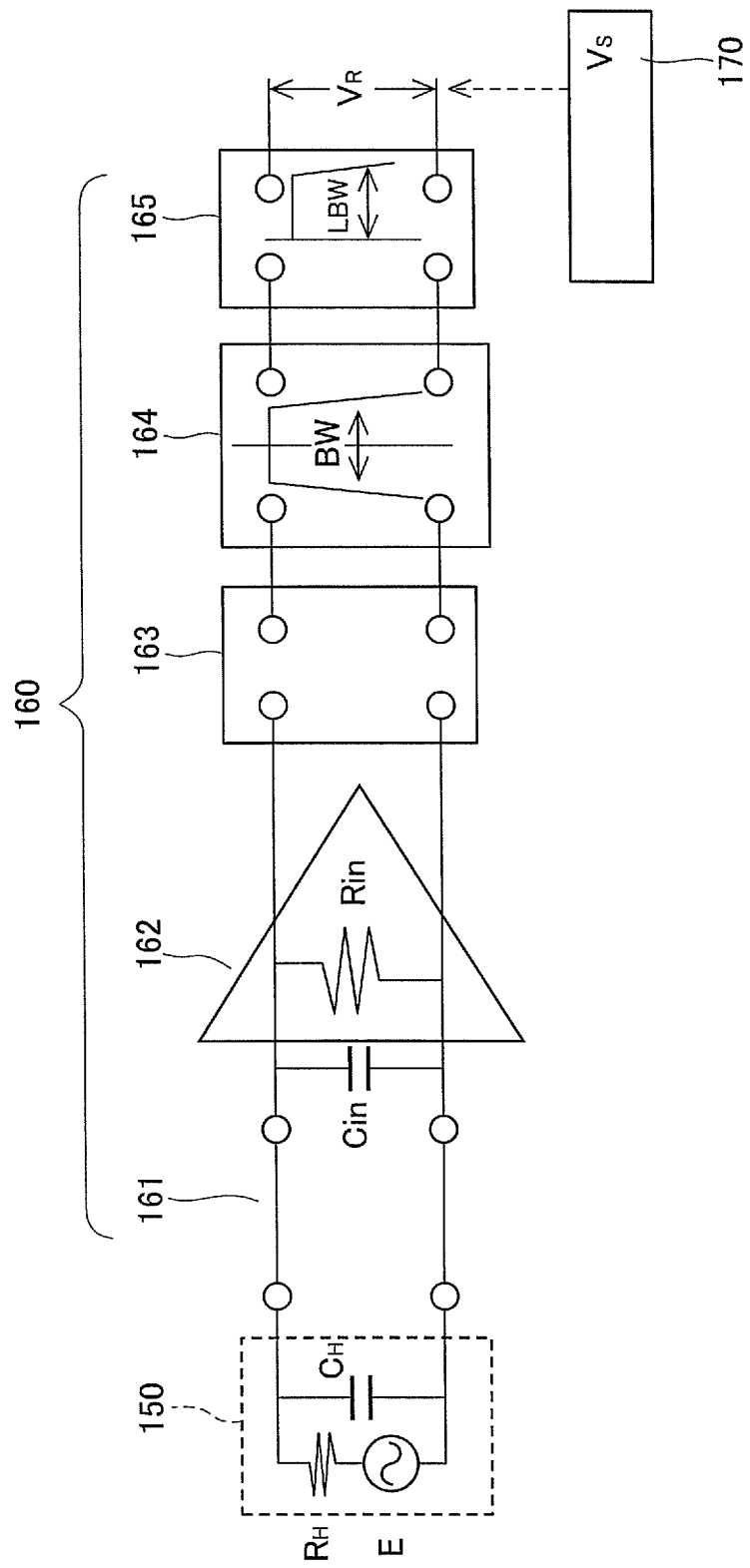
FIG. 4 shows a basic composition of a measuring circuit system connected to the magnetic sensor of a TMR element.

FIG. 1 schematically shows a perspective view of the summary composition of a magnetic field measuring apparatus for measuring the in-plane high-frequency magnetic field generated by a microwave-assisted magnetic head. FIG. 2 schematically shows the principle behind using a magnetic field measuring apparatus to measure the in-plane high-frequency magnetic field generated by a microwave-assisted magnetic head. FIG. 3 illustrates a graph showing one example of the effects of spacing when measuring the in-plane high-frequency magnetic field. FIG. 4 shoes the basic composition of a measuring circuit system connected to the magnetic sensor of a TMR element.

As shown in FIG. 1, the magnetic field measuring apparatus according to the present invention is provided with an anchoring mechanism 110 for holding and anchoring the microwave-assisted magnetic head 120 that is the target of measurement, a high-frequency current driving system 130 for applying a high-frequency current on the microwave generation mechanism 122 equipped with the microwave-assisted magnetic head 120, a magnetic sensor 150 having a TMR element for measuring the intensity of the in-plane high-frequency magnetic field 122a generated from the microwave generation mechanism 122, a measuring circuit system 160 connected to the magnetic sensor 150, and a stage 155 capable of moving in the three dimensions of the X, Y and Z axes and on which the magnetic sensor 150 is mounted.

A stand-type holding device shown in FIG. 1 is one example of the anchoring mechanism 110 for anchoring the microwave-assisted magnetic head, but there are no particular limitations on this mechanism. It is particularly important for the structure of the anchoring mechanism 110 to surely hold an object, while not holding the measured part, so that the in-plane high-frequency magnetic field 122a can be easily measured, and the in-plane high-frequency magnetic field 122a generated from the microwave-assisted magnetic head 120 can be easily accomplished. This holding and anchoring includes a mechanism that can accomplish positional anchoring through simply being placed. In addition, the microwave-assisted magnetic head 120 that is the target of measurement may be measured as the head portion alone, or may be measured in the assembled state as a so-called head gimbal assembly.

The microwave generation mechanism 122 is made of various parts provided with a self-excited or an induced-type microwave generation element, as described above.

In addition, the in-plane high-frequency magnetic field 122a generated from the microwave generation mechanism 122 is generated along the X-Z plane in FIG. 1.

The high-frequency current driving system 130 is provided with a system that can supply a predetermined high-frequency current so that the in-plane high-frequency magnetic field 122a can be generated from the microwave generation mechanism 122.

(Explanation of System for Measuring Intensity of In-Plane High-Frequency Magnetic Field 122a)

Next, the system for measuring the intensity of the in-plane high-frequency magnetic field 122a generated from the microwave generation mechanism 122 will be explained.

The intensity of the in-plane high-frequency magnetic field 122a is measured by the magnetic sensor 150 positioned facing the microwave-assisted magnetic head 120. The magnetic sensor 150 having a TMR element is an element having a so-called tunnel barrier film and a structure in which this tunnel barrier film is interposed between two ferromagnetic layers. The sensor 150 is similar to that used in the reading element in the thin-film head. The TMR element has large element resistance and large output, and thus has the advantage that the SN ratio is large, but conversely has the disadvantage that responsiveness to a high-frequency magnetic field is poor. Hence, in the present invention, the composition of the measuring circuit system 160 connected to the magnetic sensor 150 is devised so as to improve responsiveness to this high-frequency magnetic field. This is explained below.

The magnetic sensor 150, which contains the TMR element as a main component, is mounted on the stage 155, which is capable to move in the three dimensional directions of X, Y, and Z axes.

Adjusting the distance of the spacing of the microwave-assisted magnetic head 120 in the Z direction is an extremely important operation. Namely, it is necessary to weaken the in-plane high-frequency magnetic field of around 1 kOe or more generated by the microwave-assisted magnetic head 120 to around 0.1 to 50 (Oe) in which the TMR element can linearly respond. In other words, the sensitivity must be controlled around 1/100 (−40 dB). For that reason, it is necessary for the spacing Zs, which are the gap distance in the Z direction, to be adjusted to around 0.3 to 30 μm.

This is explained in greater detail with reference to FIG. 2 and FIG. 3. As noted above, FIG. 2 schematically shows the principle behind using a magnetic field measuring apparatus to measure the intensity of the in-plane high-frequency magnetic field 122a generated by the microwave-assisted magnetic head 120. In FIG. 2, the TMR element (150), which is a main component of the magnetic sensor 150 of the magnetic field measuring apparatus, is positioned opposite to the supplementary coil 24 for driving the alternating current in the microwave band, which is set in the gap between a main magnetic pole 20 and an auxiliary magnetic pole 23. Both sides of the TMR element (150) are magnetically shielded by shield members 151.

Calculation of the in-plane high-frequency magnetic field is tested taking into consideration the effects of the spacing Zs. The gap magnetic field Hg generated in FIG. 2 is 20,000 Oe (=2 T), and the half-gap G=15 nm. FIG. 3 shows the results of calculating the correlation between the spacing Zs (nm) and the received magnetic field intensity Hx (Oe). As shown in FIG. 3, by adjusting the spacing Zs, it is possible to arbitrarily control the received magnetic field intensity Hx.

For reference, the data for received magnetic field intensity Hx (Oe) and spacing Zs (nm) are noted in Table 1 below.

TABLE 1

| Zs (nm) | Hx (Oe) |
|---|---|
| 15 | 10000 |
| 30 | 5860 |
| 50 | 3960 |
| 75 | 2510 |
| 150 | 1260 |
| 300 | 637 |
| 500 | 382 |
| 750 | 254 |
| 1500 | 127 |
| 3000 | 63 |
| 5000 | 38 |
| 7500 | 25 |
| 15000 | 13 |

When the TMR element is used as the sensor, the measurement can be performed with a tolerance within a range of a few microns per meter. Therefore, this is an advantage that the adjustment of the closeness (managing the distance) becomes easy.

The distance in the Z direction can be determined with a certain margin (not necessary to fix the distance at the beginning), so it is fine to seek the magnetic field intensity profile through scanning in the X and Y directions.

The three-dimensional movement mechanism in the X, Y and Z directions may, for example, accomplish minute movements in the X, Y and Z directions through a micro-driving element using various types of piezoelectric bodies.

The magnetic sensor 150, which contains this type of TMR element as a main component, is linked to the measuring circuit system 160. The measuring circuit system 160 in the present invention has an amplifier and a band-pass filter connected in order on the output terminal side of the TMR element that is the magnetic sensor 150. Furthermore, the measuring circuit system 160 is configured so that the S/N ratio (SNR) is 3 dB or greater, the S/N ratio being the ratio of the amplitude S of the high-frequency generated signal induced in the TMR element to the total noise N found by summing the head noise generated by the TMR element and the circuit noise generated by the amplifier. Erroneous detection may occur when the S/N ratio is small, the S/N ratio is preferably 3 dB or greater.

The band-pass filter is a basic frequency of which the peak passing frequency is selected from a range of 10 to 40 GHz. The peak passing frequency is a center of the band. Further, the band-pass filter is a narrow band-pass filter of which the band width is in a range of ±0.5 to ±4 GHz, preferably ±0.5 to ±2 GHz, that is centering the basic frequency.

Theoretically, the narrower the band width is the more S/N ratio increases. However when the band width is too narrow, the gain from the central frequency might decline, or waveform distortion might occur. A design of a band-pass filter that does not cause such problems is required.

The above-described basic frequency is selected from within 10 to 40 GHz in order to match the ferromagnetic resonant frequency of the magnetic recording film that is the target of recording and the frequency band emitted by the microwave-assisted magnetic head that is the target of measurements.

A preferred example of the measuring circuit system 160 is shown in FIG. 4.

As shown in FIG. 4, the measuring circuit system 160 is linked to the magnetic sensor 150, and is configured by connecting a transfer circuit 161, a pre-amplifier 162 that is one amplifier, a main amplifier 163 that is one amplifier, a band-pass filter 164 and a low-pass filter 165 in sequence. A comparator 170 is connected for determining good or bad at the end.

In the magnetic sensor 150 surrounded by the dotted line in FIG. 4, reference character E indicates a high-frequency magnetic field detection voltage, reference character $R_H$ indicates the resistance of the TMR element and reference character $C_H$ indicates the capacitance of the TMR element. Reference character $R_{in}$ indicates the input resistance of the pre-amplifier 162 and reference character $C_{in}$ indicates the input capacitance of the pre-amplifier 162.

The low-pass filter 165 is not necessarily required, but providing this offers the advantage that it is possible to improve the S/N ratio for the measuring system as a whole. It is preferred that the low-range blocking frequency is around 50 MHz and that the high-range blocking frequency is set around 1.3 times larger than the ferromagnetic resonant frequency of the recording film.

In the comparator 170, a comparison is performed of the standard voltage $V_S$ and the regeneration voltage $V_R$ measured at the final point of the filter of the measuring circuit system 160. When the regeneration voltage $V_R$ is greater than the standard voltage $V_S$, the product is determined to be good. As the terminus of the filter, the band-pass filter 164 is the terminus in a composition having only a band-pass filter 164, while in a compound composition with a band-pass filter 164 and low-pass filter 165, the low-pass filter 165 is the terminus.

The measuring operation using the magnetic field measuring apparatus is performed as described below.

The magnetic sensor 150 mounted on the stage 155 is positioned facing the ABS (the so-called opposing surface of the magnetic recording medium) of the microwave-assisted magnetic head 120 anchored by the anchoring mechanism. Furthermore, by applying a high-frequency current on the microwave generation mechanism 122 equipped with the microwave-assisted magnetic head 120 from the high-frequency current driving system 130, the in-plane high-frequency magnetic field 122a is generated from the microwave generation mechanism 122. Simultaneously, the stage is moved such that the magnetic sensor scans a predetermined region of the ABS. Thereby, the in-plane high-frequency magnetic field intensity from the microwave-assisted magnetic head is detected by the magnetic sensor, and the magnetic field intensity profile is obtained.

(Explanation of Microwave-Assisted Magnetic Head that is Target of Measurement by Magnetic Field Measuring Apparatus of Present Invention)

Next, the structure of the microwave-assisted magnetic head that is the target of the in-plane high-frequency magnetic field intensity measuring apparatus of the present invention will be explained.

As noted above, microwave-assisted magnetic heads can be broadly classified into two types: self-excited and induced-type.

First, an ideal example of the induced-type will be described with reference to FIG. 5 through FIG. 8.

(Explanation of One Example of Induced-Type Microwave-Assisted Magnetic Head)

Figure 5:
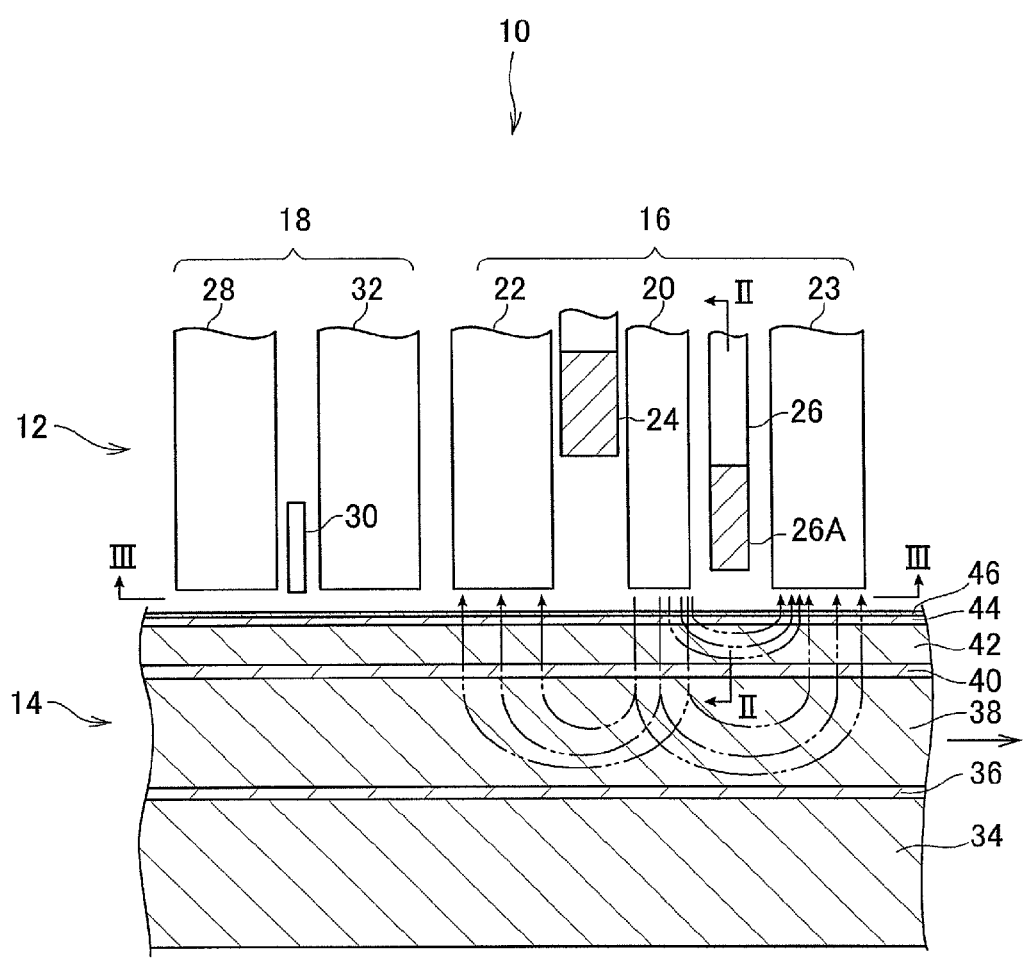
FIG. 5 shows a cross-section perpendicular to the track width direction of a magnetic recording medium and a thin film magnetic head that is configured with a supplementary coil between the main magnetic pole and the auxiliary magnetic pole of the magnetic head and to generate the in-plane alternating magnetic field by driving (applying) an alternating current in the microwave band to the supplementary coil.

As shown in FIG. 5, the thin-film magnetic head 12 has a recording head 16 and a reproducing head 18. The magnetic recording medium 14 is provided so as to face this thin-film magnetic head.

The recording head 16 is configured to have a main magnetic pole 20, a leading shield (auxiliary magnetic pole) 22 positioned on the front edge of the recording side, a trailing shield (auxiliary magnetic pole) 23 positioned on the trailing edge of the recording side, a main coil 24 for generating a perpendicular recording magnetic field in the main magnetic pole 20 and a supplementary coil 26 for generating an in-plane alternating magnetic field with frequencies in the microwave band in the main magnetic pole 20. The recording head 16 is configured such that the maximum value of the in-plane alternating magnetic field is smaller than the maximum value of the perpendicular recording magnetic field.

The perpendicular recording magnetic field is a magnetic field applied in a substantially perpendicular direction (up and down on the surface of the paper) on the lamination layer surface of the recording layer 42 of the magnetic recording medium 14. In addition, the in-plane alternating magnetic field is a magnetic field applied in a direction substantially parallel to the surface of the lamination layer surface of the recording layer 42.

Figure 6:
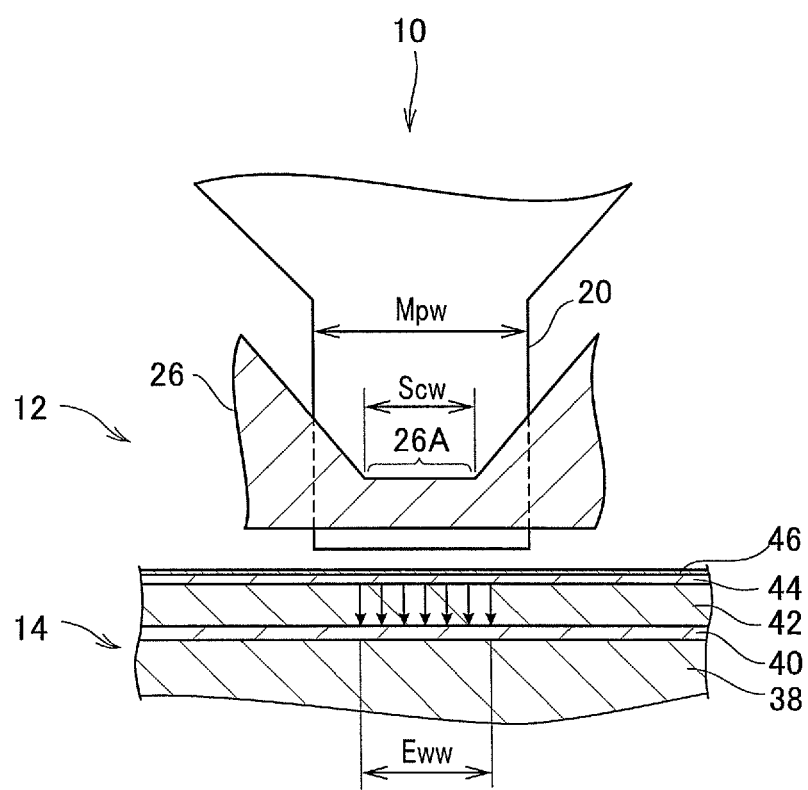
FIG. 6 is a cross-section taken along line II-II in FIG. 5.

As shown in FIG. 6, the main magnetic pole 20 is configured such that the tip close to the magnetic recording medium 14 is narrower (tapered) than the base side when viewed from the leading shield 22 or the trailing shield 23. In this drawing, the width of the tip is indicated by Mpw. With such a configuration, it is possible to concentrate the writing magnetic flux.

Figure 7:
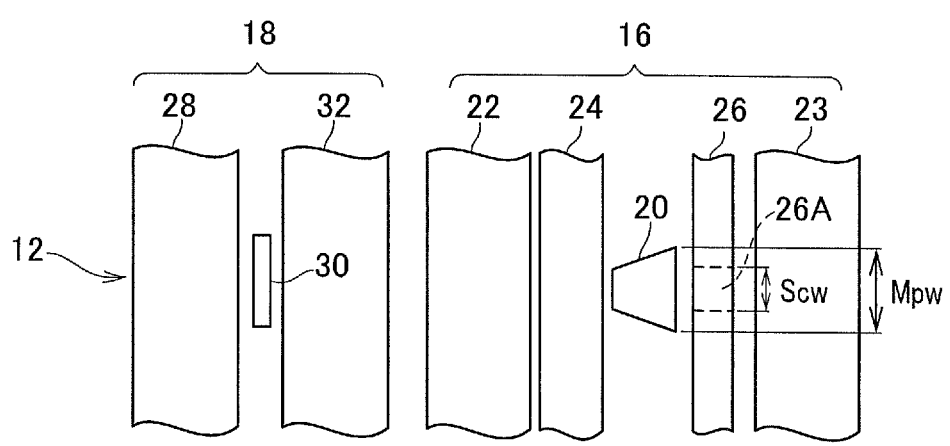
FIG. 7 illustrates a medium opposing surface (or ABS) of the thin film head viewed from the direction of the arrow along line in FIG. 5.

FIG. 7 shows a bottom view of the thin-film magnetic head as viewed from the magnetic recording medium 14 side, and shows a so-called ABS. As shown in FIG. 7, the tip of the main magnetic pole 20 has a roughly trapezoidal shape which is narrowing in the direction from the trailing shield 23 side to the leading shield 22 side. The maximum width of the main magnetic pole 20, indicated by the reference character Mpw, is the width of the surface facing the trailing shield 23 (the maximum width of the trapezoid).

Compared to the width Mpw of the tip of the main magnetic pole 20, the widths of the leading shield 22 and the trailing shield 23 are exceptionally large. The leading shield 22 and the trailing shield 23 are linked to the base of the main magnetic pole 20, although such is not shown in the drawing.

In order to make the direction of the perpendicular recording magnetic field applied on the recording layer 42 approach the direction perpendicular to the surface of the magnetic recording medium 14, the gap between the main magnetic pole 20 and the leading shield 22 is preferably 1 μm or more. In addition, the gap between the main magnetic pole 20 and the trailing shield 23 is preferable 10 to 100 nm, and more preferably around 50 nm.

The main coil 24 is positioned at the leading shield 22 side of the main magnetic pole 20 so as to enclose a linkage part (not shown) between the main magnetic pole 20 and the leading shield 22. In FIG. 5, the main coil 24 is shown in the case of one winding but this is intended to be illustrative and not limiting. Two or more windings would also be fine. In addition, in FIG. 5 the main coil is single-layered, but this may be multi-layered.

The supplementary coil 26 is positioned on the trailing shield 23 side of the main magnetic pole 23 so as to enclose an linkage part (not shown) between the main magnetic pole 20 and the trailing shield 23. As shown in this figure, a portion of the supplementary coil 26 is positioned between the main magnetic pole 20 and the trailing shield 23. The thickness of the supplementary coil 26 is preferably 10 to 50 nm.

In general, the tip that is the surface of the main magnetic pole 20 facing the magnetic recording medium is polished in the head manufacturing process. Accordingly, in order to avoid the supplementary coil 26 being polished, it is preferred to position (indent) the tip of the supplementary coil 26 around 10 nm or more behind from the tip of the main magnetic pole 20 in the separating direction from the magnetic recording medium 14.

The supplementary coil 26 is provided with an alternating magnetic field transmission part 26A at a position opposite to the magnetic recording medium 14. Namely, the alternating magnetic field transmission part 26A has a shape that is virtually constant in the cross-section perpendicular to the direction of width, as shown in FIG. 5. Moreover, the alternating magnetic field transmission part 26A is shaped so as to be roughly parallel in the direction of width and with a cross-sectional area that is smaller than the other parts of the supplementary coil 26, as shown in FIG. 6.

In addition, it is preferable for the width Sew of the alternating magnetic field transmission part 26A of the supplementary coil 26 to be set smaller than the width Mpw of the tip of the main magnetic pole 20, as shown in FIG. 6.

In FIG. 5, the supplementary coil 26 has a single winding, but the number of windings of the supplementary coil is not particularly limited and may be two or more. In addition, in FIG. 5 the supplementary coil has a single layer but is not particularly restricted to this and may be multi-layered with two or more layers. By increasing the number of windings and number of layers of the supplementary coil 26, it is possible to enlarge the in-plane alternating magnetic field while curtailing the current supplied to the supplementary coil 26.

The supplementary coil is exemplary shown in these drawings, which is only positioned between the main magnetic pole 20 and the trailing shield 23, but it would also be fine to position multiple thick coils with dimensions of several μm farther away from the ABS.

Figure 13:
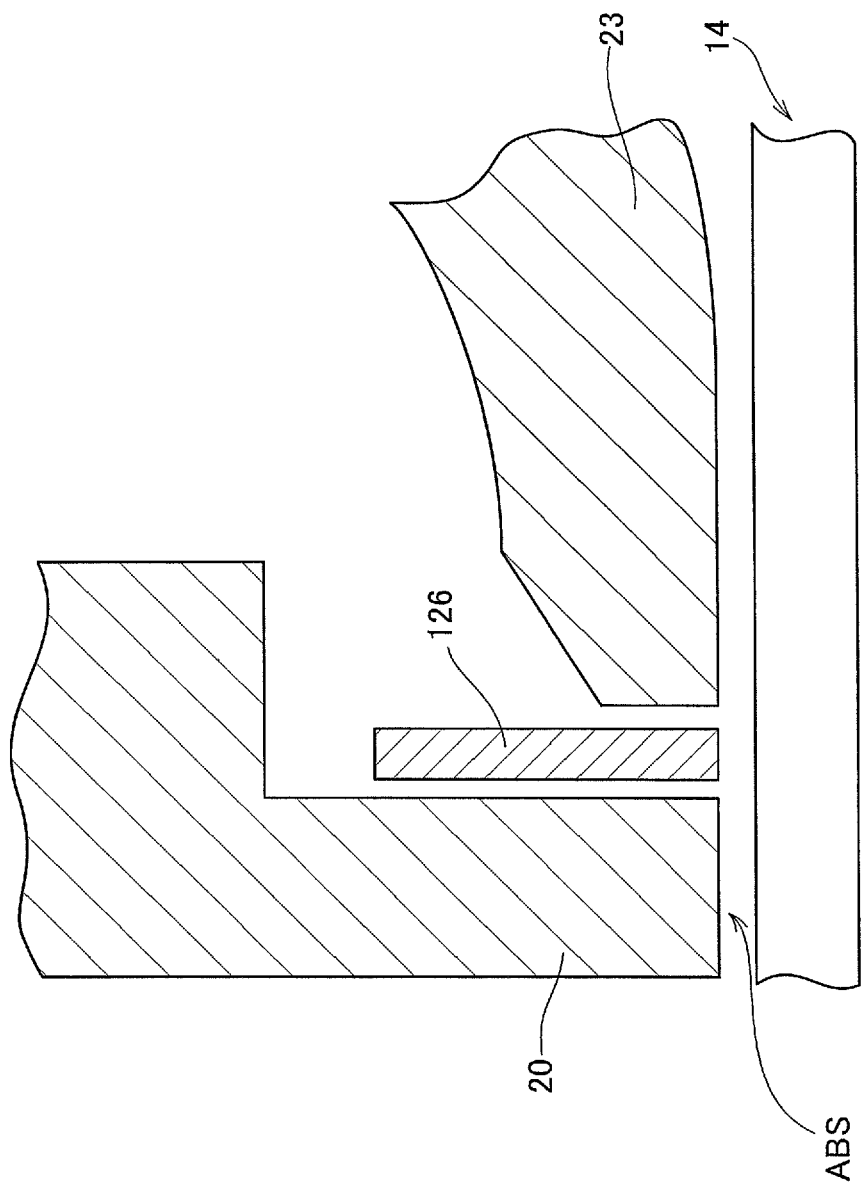
FIG. 13 illustrates another preferred configuration of a thin-film magnetic head that provides a supplementary coil between the main magnetic pole and the auxiliary magnetic pole of the magnetic head and in which an alternating current in the microwave band is driven in the supplementary coil, generating an in-plane alternating magnetic field. The figure is an enlarged view of the vicinity of the ABS and a schematic cross-sectional view perpendicular to the track width direction (reference number 14 indicates a magnetic recording medium shown for reference so the positional relationship is clear).

The coil may be single-winding or multiple-winding. With such a coil, it is possible to apply a large driving current and to increase a recording magnetomotive force (magnetomotive force, or motivated magnetic field). Concrete configurations of these are shown, for example, in FIG. 13 to FIG. 16, respectively. FIG. 13 illustrates another preferred configuration of a thin-film magnetic head that provides a supplementary coil between the main magnetic pole and the auxiliary magnetic pole of the magnetic head and in which an alternating current in the microwave band is driven in the supplementary coil, generating an in-plane alternating magnetic field. The figure is an enlarged view of the vicinity of the ABS and a schematic cross-sectional view perpendicular to the track width direction (reference number 14 indicates a magnetic recording medium shown for reference so the positional relationship is clear). The tip shapes of the main magnetic pole 20 and the auxiliary magnetic pole 23 of the magnetic head near the ABS are formed extremely narrow (tapered), as illustrated in FIG. 13, and the supplementary coil 126 arranged in this small gap is provided with a shape that is extended to the rear side, which is the direction opposite the ABS, while the ABS side of the supplementary coil 126 is positioned in substantially the same position as the tips of the main magnetic pole 20 and the auxiliary magnetic pole 23. Furthermore, the length of the supplementary coil 126 in the track width direction is the same length or longer than the length of the tip of the main magnetic pole 20 in the track width direction. With this composition, it becomes possible to apply a large driving current and to increase the magnetomotive force (motivated magnetic field).

Figure 14:
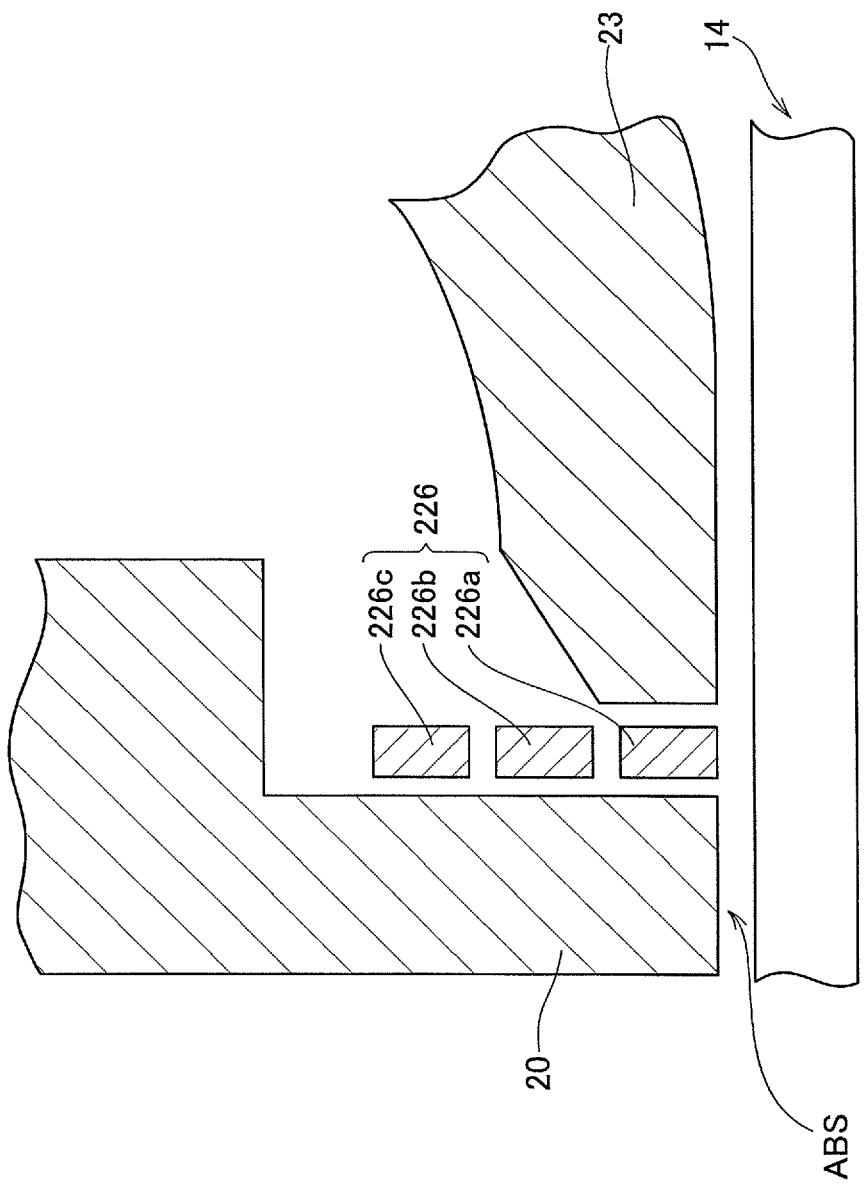
FIG. 14 illustrates another preferred configuration of a thin-film magnetic head that provides a supplementary coil between the main magnetic pole and the auxiliary magnetic pole of the magnetic head and in which an alternating current in the microwave band is driven in the supplementary coil, generating an in-plane alternating magnetic field. The figure is an enlarged view of the vicinity of the ABS and a schematic cross-sectional view perpendicular to the track width direction (reference number 14 indicates a magnetic recording medium shown for reference so the positional relationship is clear).

The primary characteristic of the preferred configuration of the supplementary coil 226 shown in FIG. 14 is that the supplementary coil shown in FIG. 13 is partitioned into three divided coils 226a, 226b and 226c, and these are mutually connected in parallel. Through this, it becomes possible to apply a large driving current and to increase the magnetomotive force (motivated magnetic field)

Figure 15:
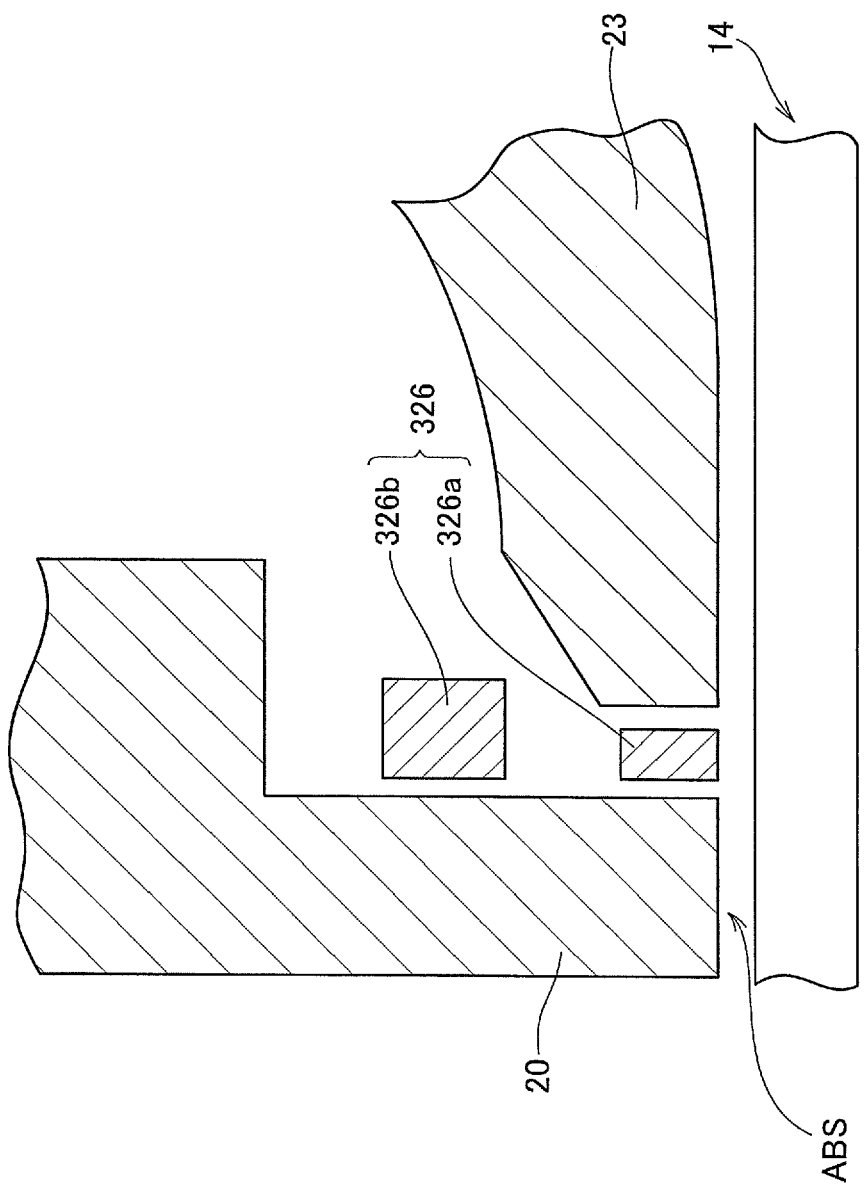
FIG. 15 illustrates another preferred configuration of a thin-film magnetic head that provides a supplementary coil between the main magnetic pole and the auxiliary magnetic pole of the magnetic head and in which an alternating current in the microwave band is driven in the supplementary coil, generating an in-plane alternating magnetic field. The figure is an enlarged view of the vicinity of the ABS and a schematic cross-sectional view perpendicular to the track width direction (reference number 14 indicates a magnetic recording medium shown for reference so the positional relationship is clear).

The primary characteristic of the preferred configuration of the supplementary coil 326 shown in FIG. 15 is that one supplementary coil 326a is formed near the ABS side and furthermore a thicker supplementary coil 326b is formed on the inner side (the side opposite the ABS). Furthermore, the lengths of the supplementary coils 326a and 326b in the track width direction are the same length or longer than the length of the tip of the main magnetic pole 20 in the track width direction. With this composition, it becomes possible to apply a large driving current and to increase the magnetomotive force (motivated magnetic field).

The primary characteristic of the preferred configuration of the supplementary coil 426 shown in FIG. 16 is that two thick supplementary coils 426a and 426b are formed in order on the inner side from the ABS. Furthermore, the lengths of the supplementary coils 426a and 426b in the track width direction are the same length or longer than the length of the tip of the main magnetic pole 20 in the track width direction. With this composition, it becomes possible to apply a large driving current and to increase the magnetomotive force (motivated magnetic field).

Each of the preferred configurations of the various supplementary coils are described above. However, these are not necessarily limited to these configurations.

Figure 8:
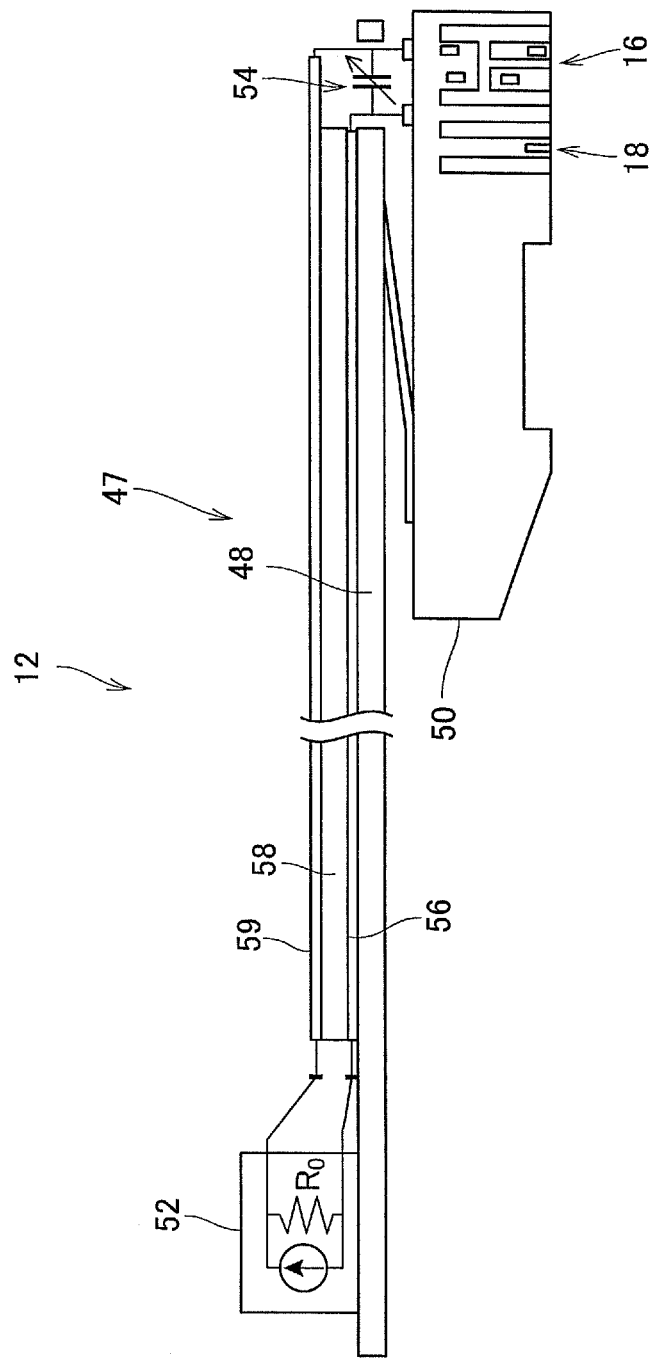
FIG. 8 shows the schematic composition of a head gimbal assembly including a supplementary coil driver, a variable capacitor and a suspension arm.

As shown in FIG. 8, the thin-film magnetic head 12 is provided with a supplementary coil electric circuit 47 (including a supplementary coil 26) in order to supply an alternating current to the supplementary coil 26. The thin-film magnetic head 12 is provided with a suspension arm 48 and a slider 50 attached to the tip thereof, and a recording head 16 and a reproducing head 18 are formed in the slider 50.

As shown in FIG. 8, the supplementary coil electric circuit 47 is provided, near the base of the suspension arm 48, with a supplementary coil driver 52 for supplying an alternating current with a frequency in the microwave band in the range of 10 to 40 GHz to the supplementary coil 26. A conductive layer 56, an insulating layer 58 and a conductive layer 59 are layered, in this order, above the suspension arm 48 in sequence. Furthermore, the supplementary coil driver 52 is electrically connected to the supplementary coil 26 via the conductive layer 56 and the conductive layer 59, which form a planar waveguide.

The supplementary coil electric circuit 47 shown in FIG. 8 has a variable capacitor (impedance adjustment element) in the vicinity of the slider 50. It is preferred to design the sympathetic frequency of the supplementary coil electric circuit 47 as close as possible to the ferromagnetic resonant frequency of the recording layer 42 of the magnetic recording medium 14.

In FIG. 5, the reproducing head 18 has a leading shield 28, a magnetic resistance effect element 30 and a trailing shield 32.

In FIG. 5, the magnetic recording medium 14 has, for example, a substrate 34, an under layer 36, a soft magnetic layer 38, an orientation layer 40, a recording layer 42, an overcoat layer 44 and a lubricating layer 46, layered in that order. The material of the recording layer 42 preferably has a perpendicular magnetic anisotropic energy of $1 \times 10^6$ erg/cc or greater. As specific materials for the recording layer 42, CoCrPt alloy may be used, for example. The ferromagnetic resonant frequency of the recording layer 42 is a unique value for each material that is determined by the component elements and the shape of the magnetic particles that configure the recording layer 42, or the like. The magnetic recording medium 14 is attached to an unrepresented rotating mechanism so as to rotate in the direction indicated by the arrow in FIG. 5 (the right direction in FIG. 5).

The action of this type of thin-film magnetic head 12, and in particular the recording head 16, is described below.

Namely, by supplying a direct current to the main coil 24 of the recording head 16, the main coil 24 generates a direct current magnetic field. This direct current magnetic field flows through the main magnetic pole 20, the soft magnetic layer 38 of the magnetic recording medium 14, the leading shield 22 and the trailing shield 23. Then, a perpendicular recording magnetic field is applied to the recording layer 42 in the direction perpendicular to the surface of the magnetic recording medium 14.

On the other hand, when the supplementary coil electric circuit 47 supplies an alternating current with a frequency in the microwave band in the range of 10 to 40 GHz to the supplementary coil 26, the supplementary coil 26 generates an alternating magnetic field. This alternating magnetic field is primarily transmitted to the main magnetic pole 20 and the trailing shield 23 from the alternating magnetic field transmission part 26A. Since this alternating magnetic field is high-frequency, due to the skin effect, the alternating magnetic field penetrates the main magnetic pole 20 and the trailing shield 23. Particularly, the alternating magnetic field penetrates only limited parts in the vicinity of the surface parts facing the alternating magnetic field transmission part 26A with respect to the main magnetic pole 20 and the trailing shield 23.

In this manner, the alternating magnetic field generated by the supplementary coil 26 is generated limited to the parts where the gap between the main magnetic pole 20 and the trailing shield 23 is small but reaches the deepest parts of the magnetic recording medium 14. Namely, the alternating magnetic field generated by the supplementary coil 26 flows through the main magnetic pole 20, the recording layer 42 and the trailing shield 23 so as to penetrate the recording layer 42 in a direction substantially parallel to the surface of the magnetic recording medium 14.

By applying the in-plane alternating magnetic field with a frequency in the microwave band on the recording layer 42, it is possible to greatly reduce the recording magnetic field in the perpendicular direction that is needed for the perpendicular magnetic recording. For example, compared to the case of not applying the in-plane alternating magnetic field, by applying the in-plane alternating magnetic field it becomes possible to reduce the perpendicular magnetic field, which can reverse the magnetism of the recording layer 42 by 40% or more, and furthermore, reduction of up to around 60% is possible.

(Explanation of One Example of Self-Excited Type of Microwave-Assisted Magnetic Head)

Next, an ideal example of a self-excited microwave-assisted magnetic head will be simply explained with reference to FIG. 9.

Figure 9:
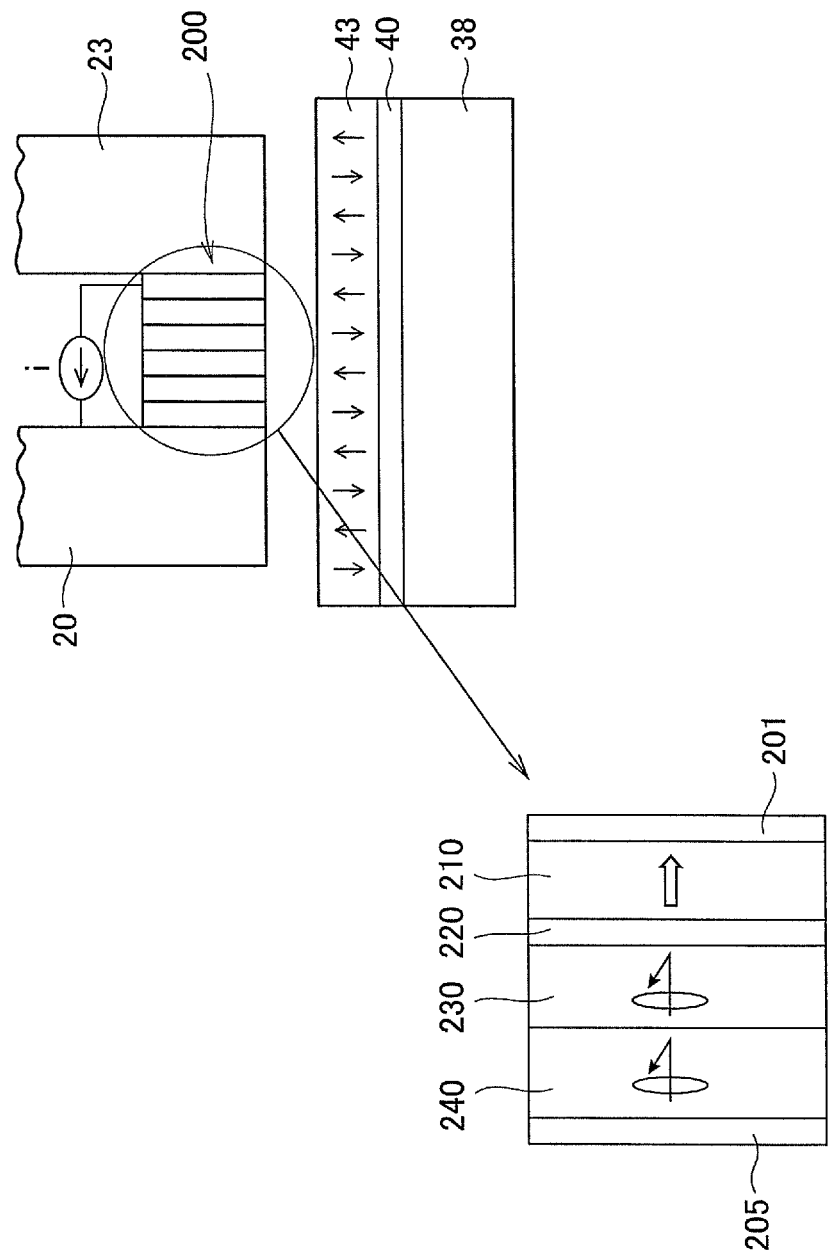
FIG. 9 is a schematic vertical cross-section in the track width direction of the magnetic recording medium and a thin-film magnetic head that is a spin torque oscillator (STO) formed with multiple layers of magnetic thin film in a gap between the main magnetic pole and auxiliary magnetic pole of the magnetic head.

FIG. 9 shows the components of self-excited microwave assisted recording that could be called the basic composition. This composition is disclosed in the Reference Document: IEEE Transactions on Magnetics, Vol. 44, No. 1, January 2008, pp 125-131.

This self-excited microwave-assisted magnetic head is composed, in a regular recording head structure, by inserting a microwave generating element 200 having a structure similar to the MR element, such as a TMR element or CPP-GMR element or the like, between the main magnetic pole and the trailing shield (same meaning as the auxiliary magnetic pole) thereof.

With regard to the magnetic recording medium 14, the configuration in above-described FIG. 5 is simplified and only the soft magnetic layer 38, the orientation layer 40 and the recording layer 42 are shown, but the actual composition is the same as the configuration shown in FIG. 5. The composition of the recording head is shown simplified as well, but the composition of the actual recording and shield cores are the same as the configuration shown in FIG. 5.

As shown in FIG. 9, the microwave generating element 200 interposed between the main magnetic pole 20 and the auxiliary magnetic pole 23, as shown in detail in the enlarged diagram, has a reference layer 210 whose magnetization is fixed in the perpendicular direction, a metallic interlayer 220, a high saturation moment field generating layer 230 and a layer with perpendicular anisotropy 240 layered in the order. Electrodes 210 and 205 are positioned at the two sides of this layering.

The high saturation moment field generating layer 230 and the layer with perpendicular anisotropy 240 are magnetically exchange-coupled, forming an oscillating stack.

By applying a current for spin excitation from the reference layer 210 side to the oscillating stack side, perpendicularly polarized spins are transmitted to the oscillating stack (high saturation moment field generating layer 230) and the layer with perpendicular anisotropy 240 from the reference layer 210 via the metallic interlayer 220. Due to a precession movement of the oscillating stack, microwaves are generated and a high-frequency electromagnetic field is emitted.

The high-frequency electromagnetic field that is generated has a high-frequency magnetic field component in the layer in-plane direction of the perpendicular magnetized layer, at the position of the perpendicular magnetization layer of the magnetic recording medium (magnetic disk). By exposing such a high-frequency electromagnetic field to a portion of the perpendicular magnetization layer, the anisotropic magnetic field Hk of the exposed portion can be reduced. The anisotropic magnetic field Hk is a physical quantity that determines the coercive force Hc. A writing magnetic field is applied from the tip of the main magnetic pole 20 on the part where the anisotropic magnetic field Hk was reduced. With the process, it becomes possible to write to the perpendicular magnetized layer, which has an extremely large anisotropic magnetic field Hk, making it possible to realize good and so-called microwave-assisted magnetic recording.

It is preferred for the frequency of the high-frequency electromagnetic field generated from the oscillating stack that forms the above-described microwave generation element to be substantially the same as the magnetic resonant frequency of the magnetic recording layer of the magnetic recording medium that is the target of writing.

Embodiments

The invention of a device for measuring the in-plane high-frequency magnetic field produced from the microwave-assisted magnetic head described above will be explained in further detail through the concrete embodiments shown below.

First Embodiment

Comparison Example

Figure 10:
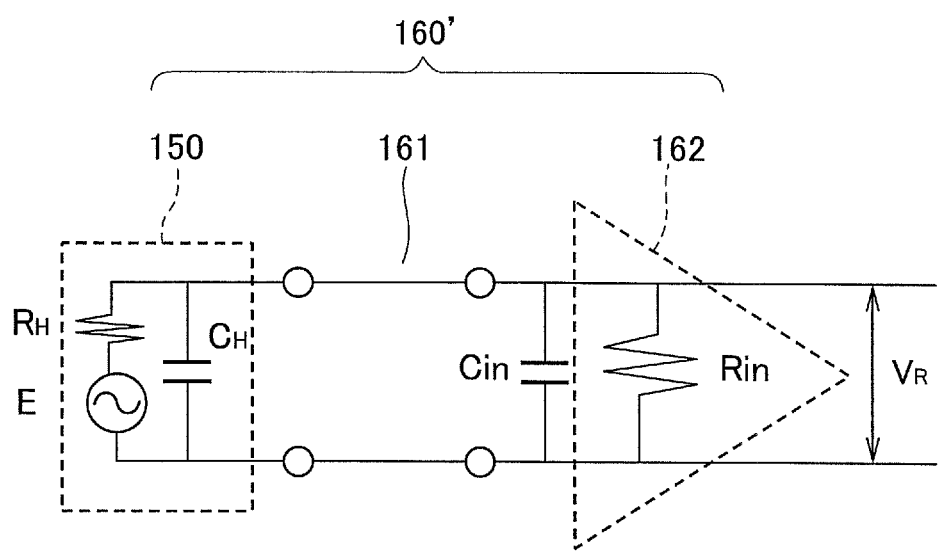
FIG. 10 shows a comparison example illustrating the measuring circuit system connected to the magnetic sensor of the TMR element.

In the measuring circuit system 160 shown in FIG. 4, the main amplifier 163, the band-pass filter 164 and the low-pass filter 165 were omitted. Furthermore, a measuring circuit system 160' of a comparison example, such as that shown in FIG. 10, was formed.

Using the measuring circuit system 160' of this type of comparison example, studies were conducted to determine whether or not it was possible to ensure the S/N ratio (hereinafter abbreviated as simple SNR) of the generated signal output.

(Calculation of Generated Output of TMR Element, TMR Element Resistance and Pre-Amplifier 162 Resistance)

In calculating the SNR, important parameters are the generated output of the TMR element 150, the generated output prior to the divided pre-amplifier 162, the TMR element resistance and the input resistance of the pre-amplifier 162. Typical values for mass-produced products were used as these values.

Namely, the TMR element resistance was 250Ω; the generated output of the TMR element was 20 mV; and the input resistance Rin of the pre-amplifier 162 was 100Ω. Using these values, the generated output Vpp prior to the pre-amplifier 162 is calculated to be:

$$Vpp=20\times(100/(100+250))=5.7\ mV$$

The SNR was measured using this generated output as the standard.

The cut-off frequency $f_0$ is expressed as:

$$f_0=(1/2\pi \cdot c \cdot R)$$

Here, $c=C_H+C_{in}$ and $R=R_{in} \cdot R_H/(R_H+R_{in})$.

Figure 11:
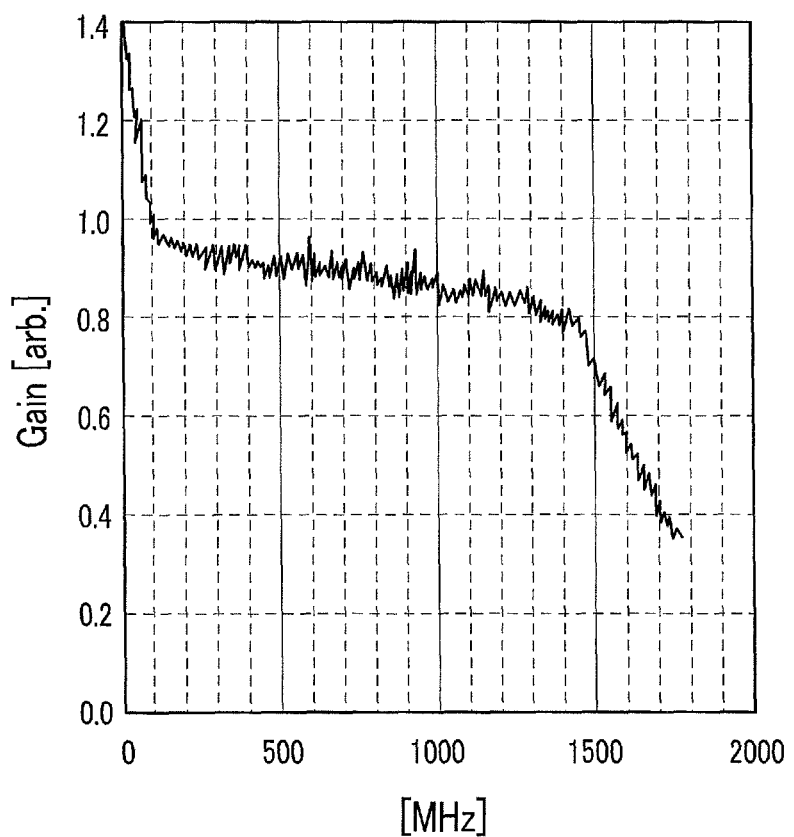
FIG. 11 is a graph illustrating the relationship between frequency and gain in the case of the comparison example of the measuring circuit system.

Assuming that the total capacitance was 2.5 pF, and when the cut-off frequency $f_0$ was calculated using the above formula, the cut-off frequency (3 dB down) was calculated around 1 GHz, roughly matching the experimental data (1 to 1.5 GHz) shown in FIG. 11. Through this, the validity of the above analytical method was confirmed. FIG. 11 shows the measured results for voltage gain properties versus frequency when the input resistance Rin of the pre-amplifier 162 was 100Ω. The voltage gain was displayed as:

$$G=|V_R/E|$$

In FIG. 11, the 3 dB cut-off frequency was around 1 GHz, virtually matching the above analysis. In the band above 1 GHz, attenuation of 20 dB/dec occurred following the gain properties of the following equation.

$$F(f) = \frac{1}{\sqrt{1+(f/fo)^2}}$$

Figure 12:
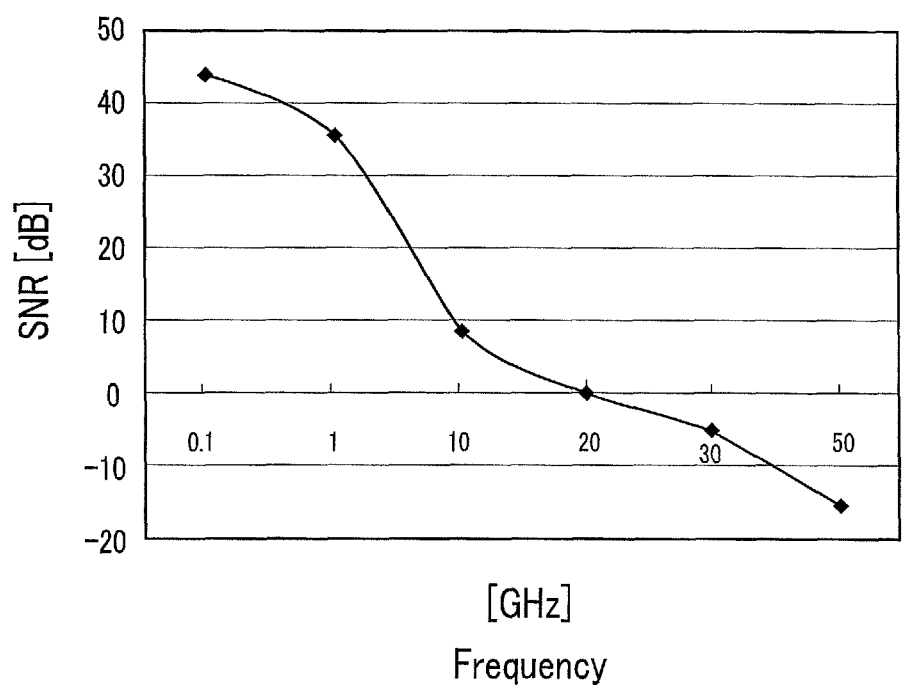
FIG. 12 is a graph showing the relationship between frequency and a signal/noise ratio (SNR) in the case of the comparison example of the measuring circuit system.

SNR (dB) versus frequency was calculated and the results are shown in FIG. 12.

From the results shown in FIG. 12, it can be seen that when the frequency is 20 GHz, SNR≈0 dB, and in the measuring circuit system 160' of the comparison example, when the frequency is a high frequency of 20 GHz or higher, discrimination of the signal is impossible so measures for improvement are necessary.

Embodiment

In place of the measuring circuit system 160' (see FIG. 10) used in the above-described comparison example, a measuring circuit system that is similar to that shown in FIG. 4 was introduced. Namely, a main amplifier 163, which is one amplifier, and a band-pass filter 164 were added next to the pre-amplifier 162. In this embodiment, the low-pass filter 165 was not used.

The main amplifier 163 used is configured to further amplify a signal that is amplified by the pre-amplifier so that discrimination processing with the comparator is possible.

Furthermore, when 20 GHz±1 GHz (band width 2 GHz) was used as the band-pass filter 164, the SNR was around 9.9 dB, so in the 20 GHz±1 GHz band, it was possible to achieve SNR=3 dB or greater.

In addition, when 30 GHz±1 GHz (band width 2 GHz) was used, the SNR was around 6.4 dB, so in the 30 GHz±1 GHz band, it was possible to clear SNR=3 dB or greater.

The efficacy of the present invention is obvious from the above experimental results.

The magnetic field measuring apparatus of the present invention has an anchoring mechanism for anchoring the microwave-assisted magnetic head that is the target of measurement, a high-frequency current drive system for applying a high-frequency current on the microwave generation included in the microwave-assisted magnetic head, a magnetic sensor having a TMR element for measuring the in-plane high-frequency magnetic field intensity generated by the microwave generation, a measuring circuit system connected to the magnetic sensor, and a stage provided capable of moving in three dimensions on which the magnetic sensor is mounted, such that the measuring circuit system has an amplifier and a band-pass filter connected in order on the output terminal side of the TMR element, the band-pass filter is a narrow range band-pass filter such that the central peak pass frequency is a basic frequency selected from within 10 to 40 GHz and the band width centered on this basic frequency is ±0.5 to ±4 GHz, and through this measuring circuit system, an S/N ratio (SNR) of 3 dB or greater is obtained, this S/N ratio being the ratio of the amplitude S of the high-frequency generated signal induced in the TMR element to the total noise N that is the sum of the head noise generated by the TMR element and the circuit noise generated by the amplifier. Consequently, this measuring apparatus can reliably and precisely measure the in-plane high-frequency magnetic field produced by a microwave-assisted magnetic head. Furthermore, such a measuring apparatus can assure high density recording and improved recording quality, and can contribute to simplifying, reducing the cost of and increasing the throughput of shipping inspections.

What is claimed is:

1. A magnetic field measuring apparatus for measuring an in-plane high-frequency magnetic field intensity that is generated from a microwave generation mechanism equipped with a microwave-assisted magnetic head, the measuring apparatus comprising:
   an anchoring mechanism for anchoring the microwave-assisted magnetic head that is a target of measurement;
   a high-frequency current driving system for applying a high-frequency current to the microwave generation mechanism equipped with the microwave-assisted magnetic head;
   a magnetic sensor having a tunneling magnetoresistive (TMR) element for measuring the in-plane high-frequency magnetic field intensity generated from the microwave generation mechanism;
   a measuring circuit system connected to the magnetic sensor; and
   a stage capable of moving in three dimensional directions on which the magnetic sensor is mounted, wherein
   the measuring circuit system has an amplifier and a band-pass filter connected in sequence on an output terminal side of the TMR element,
   the band-pass filter is a narrow-range band-pass filter such that a peak pass frequency of the filter that is a center is a basic frequency selected from a range of 10 to 40 GHz and a band width centered around the basic frequency is a narrow range of ±0.5 to ±4 GHz; and with the measuring circuit system, an S/N ratio (SNR) of 3 dB or greater is obtained, the SNR being defined by a ratio of an amplitude S of a high-frequency generated signal induced by the TMR element to a total noise N that is a sum of a head noise generated by the TMR element and a circuit noise generated by the amplifier, the microwave-assisted magnetic head that is the target of measurement provides a main magnetic pole and an auxiliary magnetic pole, a main coil for generating a perpendicular recording magnetic field is provided with the main magnetic pole, and a spin torque oscillator is provided in a gap formed with the main magnetic pole and the auxiliary magnetic pole and/or in the vicinity thereof, the spin torque oscillator being configured with multiple magnetic thin films for generating an alternating current in the microwave band.

2. The magnetic field measuring apparatus of claim 1, wherein a spin torque oscillator is oscillated and an in-plane alternating magnetic field is generated by driving a bias current to the spin torque oscillator of the microwave-assisted magnetic head, an oscillation frequency of the spin torque oscillator is substantially the same as a ferromagnetic resonant frequency of a recording layer of a magnetic recording medium that is a target of recording, and the oscillation frequency is in a range of 10 GHz to 40 GHz.

* * * * *